US009755333B2

(12) United States Patent
Laighton et al.

(10) Patent No.: US 9,755,333 B2
(45) Date of Patent: Sep. 5, 2017

(54) RADIO FREQUENCY CONNECTOR RECEPTICAL

(71) Applicant: Raytheon Company, Waltham, MA (US)

(72) Inventors: Christopher M. Laighton, Boxborough, MA (US); Istvan Rodriguez, Chelsea, MA (US); Alan J. Bielunis, Hampstead, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/201,851

(22) Filed: Jul. 5, 2016

(65) Prior Publication Data

US 2017/0162958 A1 Jun. 8, 2017

Related U.S. Application Data

(60) Provisional application No. 62/263,147, filed on Dec. 4, 2015.

(51) Int. Cl.

*H01R 12/00* (2006.01)
*H05K 1/00* (2006.01)
*H01R 12/70* (2011.01)
*H01R 43/02* (2006.01)
*H01R 24/50* (2011.01)
*H01R 103/00* (2006.01)

(52) U.S. Cl.

CPC ........... *H01R 12/707* (2013.01); *H01R 24/50* (2013.01); *H01R 43/0256* (2013.01); *H01R 2103/00* (2013.01)

(58) Field of Classification Search

CPC ...... H01R 24/46; H01R 24/50; H01R 9/0515; H01R 13/7036
USPC .......................................... 439/63, 581, 944
See application file for complete search history.

(56) References Cited

U.S. PATENT DOCUMENTS 4,718,854 A * 1/1988 Capp ...................... H01R 24/50 439/108
5,120,258 A * 6/1992 Carlton .................. H01R 24/50 439/581
5,683,255 A * 11/1997 Menze ................. H01R 13/646 439/63
5,828,555 A * 10/1998 Itoh ...................... H05K 1/0221 174/254

(Continued)

OTHER PUBLICATIONS

Prior Art Pictures provided by Inventor Istvan Rodriguez in reference to Connector Receptical, Oct. 27, 2016, 1 page.

*Primary Examiner* — Hae Moon Hyeon
(74) *Attorney, Agent, or Firm* — Daly, Crowley, Mofford & Durkee, LLP

(57) ABSTRACT

A high power RF connector receptacle having a solderable pin, an outer connector receptacle shell and a high breakdown voltage dielectric such as Silicon Carbide. The connector receptacle can be completed as a stepped process where the Silicon Carbide substrate can be mounted to the package, the pin can be dropped into place and soldered, and then the outer shell can be soldered onto the SiC substrate. Alternatively, the SiC, pin and outer shell can be assembled as a subassembly and then soldered to the package. The combination of SiC and solder gives a hermetic seal to the package. In addition, the SiC has an extraordinarily high dielectric breakdown voltage for high power connections.

1 Claim, 13 Drawing Sheets

(56) References Cited

U.S. PATENT DOCUMENTS

| | | | | | |
|---|---|---|---|---|---|
| 6,113,397 | A * | 9/2000 | Myers | H01R 24/52 | |
| | | | | 439/581 | |
| 6,474,994 | B2 * | 11/2002 | Yeh | H01R 24/52 | |
| | | | | 439/578 | |
| 6,639,154 | B1 * | 10/2003 | Cartier | H01R 24/50 | |
| | | | | 174/255 | |
| 7,766,662 | B2 * | 8/2010 | Akama | H01R 12/57 | |
| | | | | 439/581 | |
| 8,212,154 | B2 * | 7/2012 | Kashiwakura | H05K 1/0251 | |
| | | | | 174/260 | |
| 8,540,523 | B2 * | 9/2013 | Cornic | H01P 5/085 | |
| | | | | 333/260 | |

* cited by examiner

RADIO FREQUENCY CONNECTOR RECEPTICAL

CROSS REFERENCE TO RELATED APPLICATION

This application claims priority from U.S. Provisional Patent Application Ser. No. 62/263,147 filed on Dec. 4, 2015 which is incorporated herein by reference in its entirety.

TECHNICAL FIELD

This disclosure relates generally to radio frequency (RF) electrical connector receptacles and more particularly to RF electrical connector receptacles adapted for handling relatively high power RF signals.

BACKGROUND

As is known in the art, radio frequency (RF) electrical connectors adapted for mounting onto a package having therein radio frequency component come in a variety of configurations. These connector receptacles generally require a ground plane conductor mounted to a wall of the package and a signal conductor, or pin having an end passing into the interior of the package. One such connector receptacle is a coaxial connector having an outer electrically conductive outer conduit or shell which serves as the ground plane conductor, an inner electrically conductive center conductor, sometimes, as noted above, referred to as a conductive pin, used to provide the signal conductor, and a dielectric disposed between the center conductor and the outer conductor. Typical dielectrics are glass, ceramic or Teflon material. Connector receptacles using a glass dielectric are used provide a hermetic seal between the connector receptacle and package but require the glass dielectric/pin assembly to be soldered into the package and then the outer connector receptacle, or shell, is mounted separately to the package. Ceramic dielectric microstrip connector receptacles are also soldered into the package to provides a hermetic bond with the package but tends to radiate radio frequency energy creating unwanted feedback issues in packages having high gain components such as high gain amplifiers.

SUMMARY

In accordance with the present disclosure, a radio frequency energy connector receptacle is provided. The connector receptacle includes a dielectric substrate having a hole passing there-through between an upper surface of the substrate and a lower surface of the substrate. An electrically conductive layer is disposed on sidewalls of the hole, a portion of the electrically conductive layer being disposed on portions of the upper surface and lower surface of the substrate contiguous to the sidewalls of the hole. An upper electrically conductive layer is disposed on the upper surface of the substrate, such upper electrically conductive layer having an aperture there-through exposing an underlying portion of the upper surface of the substrate. A lower electrically conductive layer is disposed on the lower surface of the substrate, such lower electrically conductive layer having an aperture there-through exposing an underlying portion of the lower surface of the substrate. The aperture in the upper electrically conductive layer is vertically aligned with the aperture in the lower electrically conductive layer. The hole is disposed coaxially within the aperture in the upper electrically conductive layer and the lower electrically conductive layer. A plurality of electrically conductive vias pass through the substrate between the upper electrically conductive layer and the lower electrically conductive layer, the electrically conductive vias being disposed about the aperture in the upper electrically conductive layer and the aperture in the lower electrically conductive layer. The electrically conductive vias electrically interconnect the upper electrically conductive layer and the lower electrically conductive layer. The electrically conductive vias have a spacing less than a quarter wavelength of the operating radio frequency energy of the connector receptacle. An electrically conductive pin has a lower portion passing through the hole and is connected and bonded to the electrically conductive layer disposed on the sidewalls of the hole. A hollow electrically conductive shell is provided. A dielectric layer is disposed within the shell. The dielectric layer has an opening there-through, the electrically conductive shell being disposed around a mid-portion of the electrically conductive pin. The electrically conductive pin is disposed to provide a signal conductor for the connector receptacle and the shell providing a ground plane conductor for the connector receptacle.

In one embodiment, the pin is a solderable pin.

In one embodiment, the substrate is Silicon Carbide (SiC).

In one embodiment, the connector receptacle can be completed as a stepped process where the Silicon Carbide substrate can be mounted to the shell, the pin then dropped into place and soldered, and then the outer hosing can be soldered onto the SiC substrate.

In one embodiment, the SiC substrate, pin and outer shell can be assembled as a subassembly and then soldered to the package.

The combination of SiC and solder gives a hermetic seal to the package. In addition, the SiC has an extraordinarily high dielectric breakdown voltage for high power connections.

With such an arrangement, a high power RF connector receptacle is provided having a solderable pin, an outer connector receptacle shell and a Silicon Carbide dielectric. The connector receptacle can be completed as a stepped process where the Silicon Carbide substrate can be mounted to the package, the pin can be dropped into place and soldered, and then the outer shell can be soldered onto the SiC substrate. Alternatively, the SiC, pin and outer shell can be assembled as a subassembly and then soldered to the package. The combination of SiC and solder gives a hermetic seal to the package. In addition, the SiC has an extraordinarily high dielectric breakdown voltage for high power connections.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
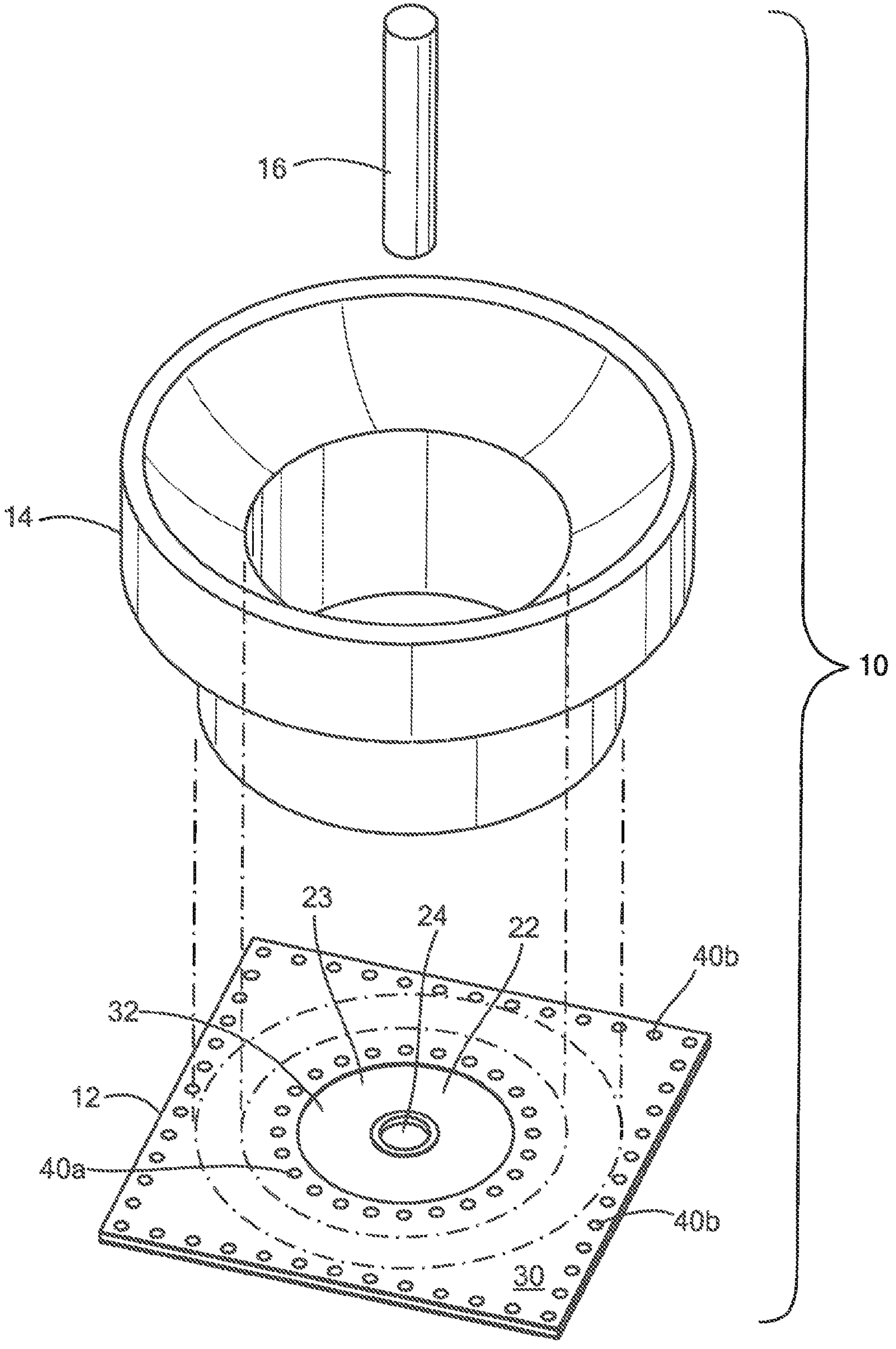
FIG. 1A is an exploded perspective view of an RF connector receptacle according the disclosure.
Figure 1C:
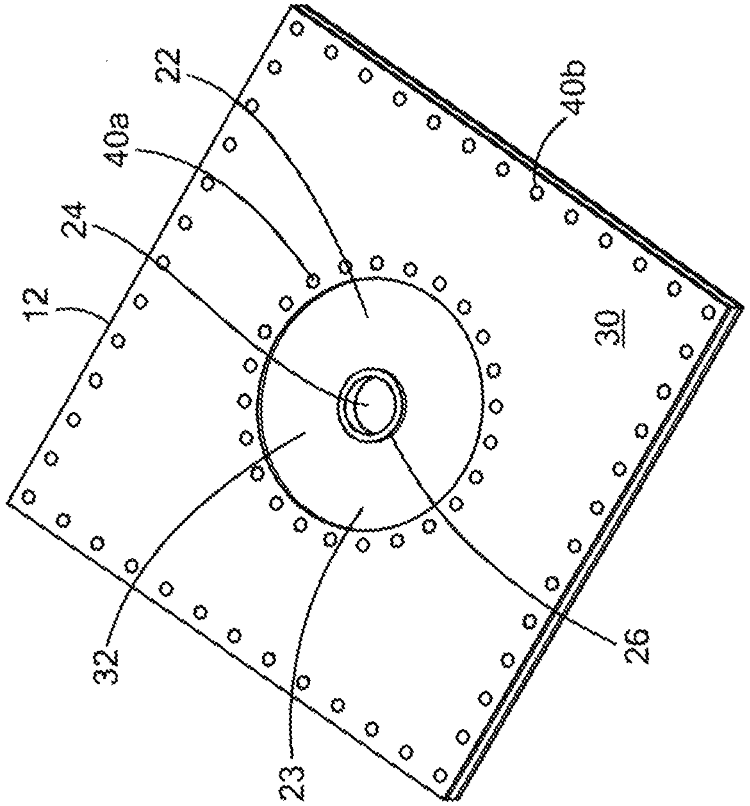
FIG. 1C is a perspective view of a base used in the RF connector receptacle of FIG. 1A according the disclosure.
Figure 1B:
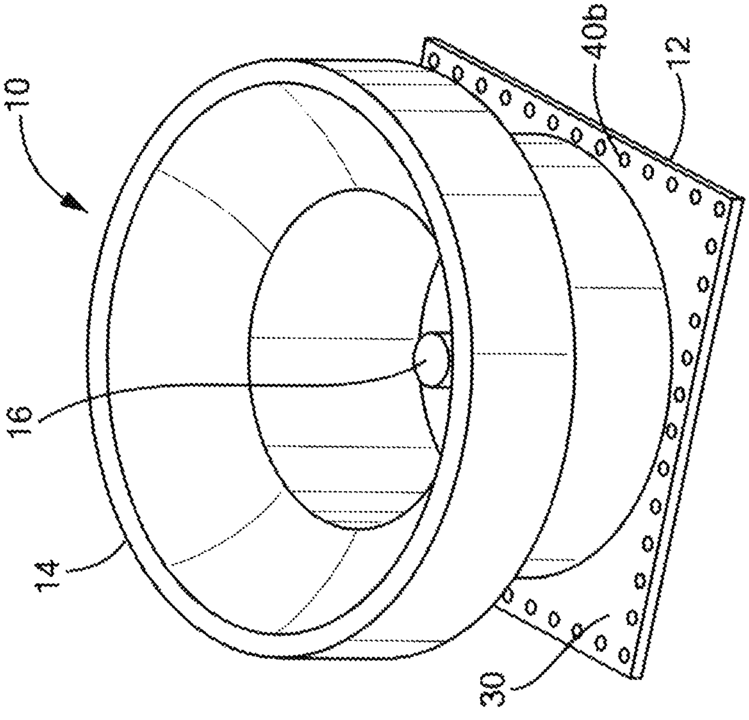
FIG. 1B is a perspective view of the RF connector receptacle of FIG. 1A after assembly according the disclosure.
Figure 2A:
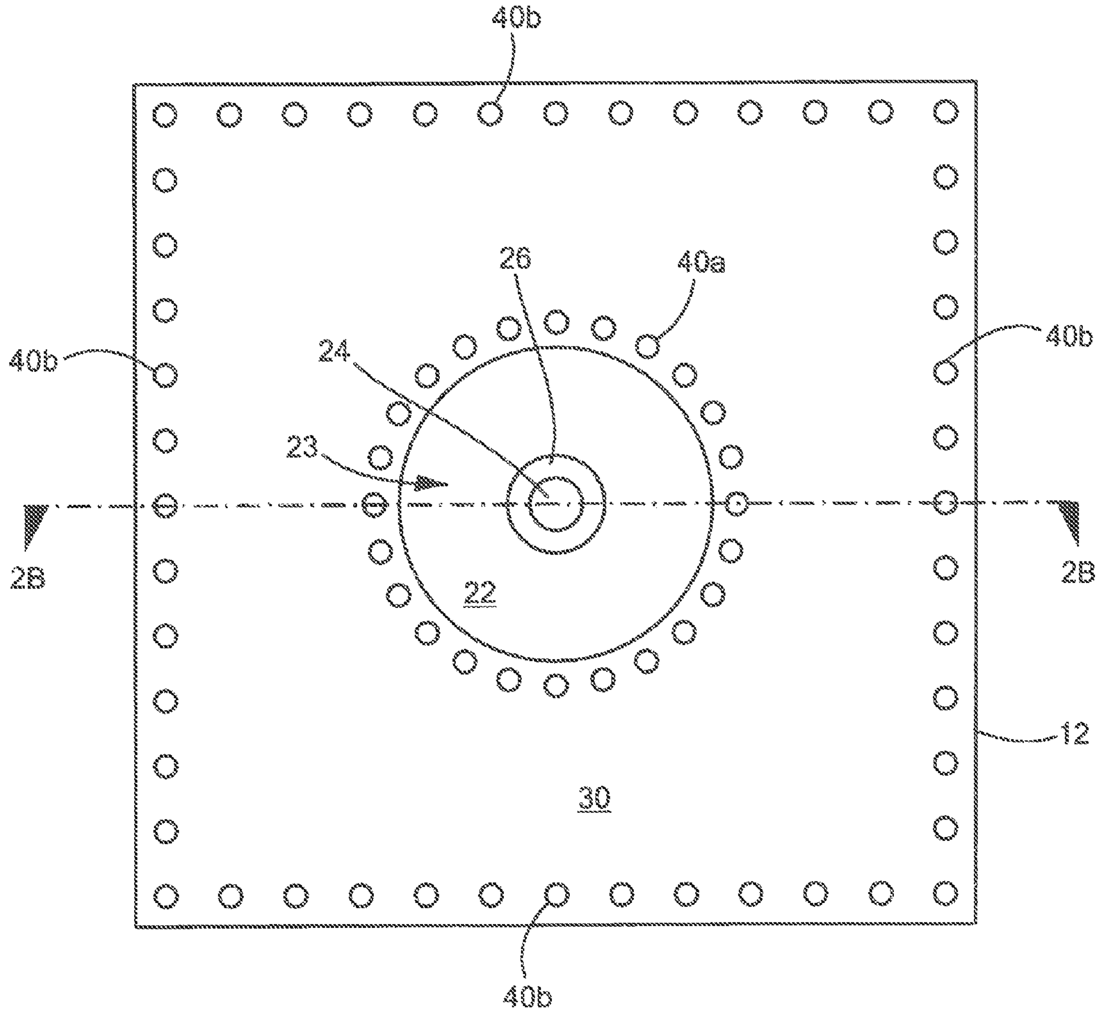
FIG. 2A is a plan view of the base used in the RF connector receptacle of FIG. 1A according the disclosure.
Figure 2B:
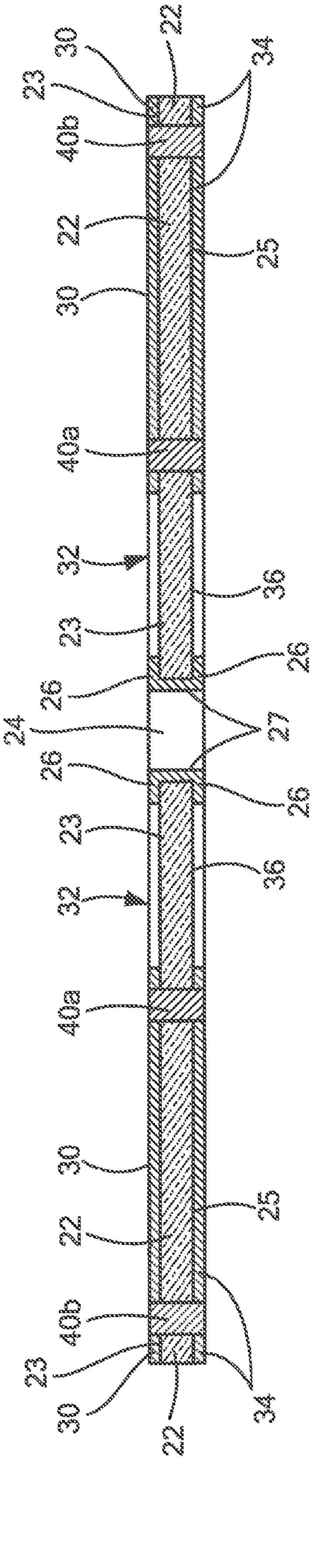
FIG. 2B is a cross sectional view of base used in the RF connector receptacle of FIG. 1A according the disclosure, such cross section being taken along line 2B-2B in FIG. 2A.

Referring now to FIGS. 1A and 1B, an RF connector receptacle 10 is shown to include: a base 12, shown in FIG. 1C, an outer shell 14, and a conductive pin 16. The base 12, shown more clearly in FIGS. 1C, 2A and 2B includes a dielectric substrate 22 having a relatively high breakdown voltage, for example in the range of 100 to 500 megavolts per meter and a thickness in the range of 3.9 to 4.1 mils here for example silicon carbide, having a hole 24 passing there-through between an upper surface 23 of the substrate 22 and a lower surface 25 of the substrate 22. An electrically conductive layer 26 (FIG. 2B) is disposed on sidewalls 27 of the hole 24, a portion of the electrically conductive layer 26 being disposed on adjacent portions of the upper surface 23 and lower surface 25 of the substrate 22 contiguous to the sidewalls 27 of the hole 24. The base 12 may be formed using conventional photolithographic-chemical or other types of etching techniques.

An upper electrically conductive layer 30, here for example gold having a thickness in the range of 0.10 to 0.15 mils is disposed on the upper surface 23 of the substrate 22, such upper electrically conductive layer 30 having an aperture 32 there-through exposing an underlying portion of the upper surface 23 of the substrate 22.

A lower electrically conductive layer 34, here for example gold having a thickness in the range of 0.10 to 0.15 mils is disposed on the lower surface 25 of the substrate 22, such lower electrically conductive layer 34 having an aperture 36 there-through exposing an underlying portion of the lower surface 25 of the substrate 22. The aperture 32 in the upper electrically conductive layer 30 is vertically aligned with, and of the same size as, the aperture 36 in the lower electrically conductive layer 34. The hole 24 is disposed coaxially within the aperture 32 in the upper electrically conductive layer 30 and the aperture 36 in the lower electrically conductive layer 34.

A plurality of electrically conductive vias 40*a*, 40*b* (FIG. 2) pass vertically through the substrate 22 between the upper electrically conductive layer 30 and the lower electrically conductive layer 34, the electrically conductive vias 40*a* being disposed about the aperture 32 in the upper electrically conductive layer 30 and the aperture 36 in the lower electrically conductive layer 34, the electrically conductive vias 40*a*, 40*b* electrically interconnecting the upper electrically conductive layer 30 and the lower electrically conductive layer 34, the electrically conductive vias 40*a* having a spacing less than an eighth wavelength of the operating radio frequency energy of the connector receptacle. It is noted that the electrical conductive vias 40*b* are disposed between the upper electrically conductive layer 30 and the lower electrically conductive layer 34 through the outer peripheral region of the substrate 22.

Figure 3:
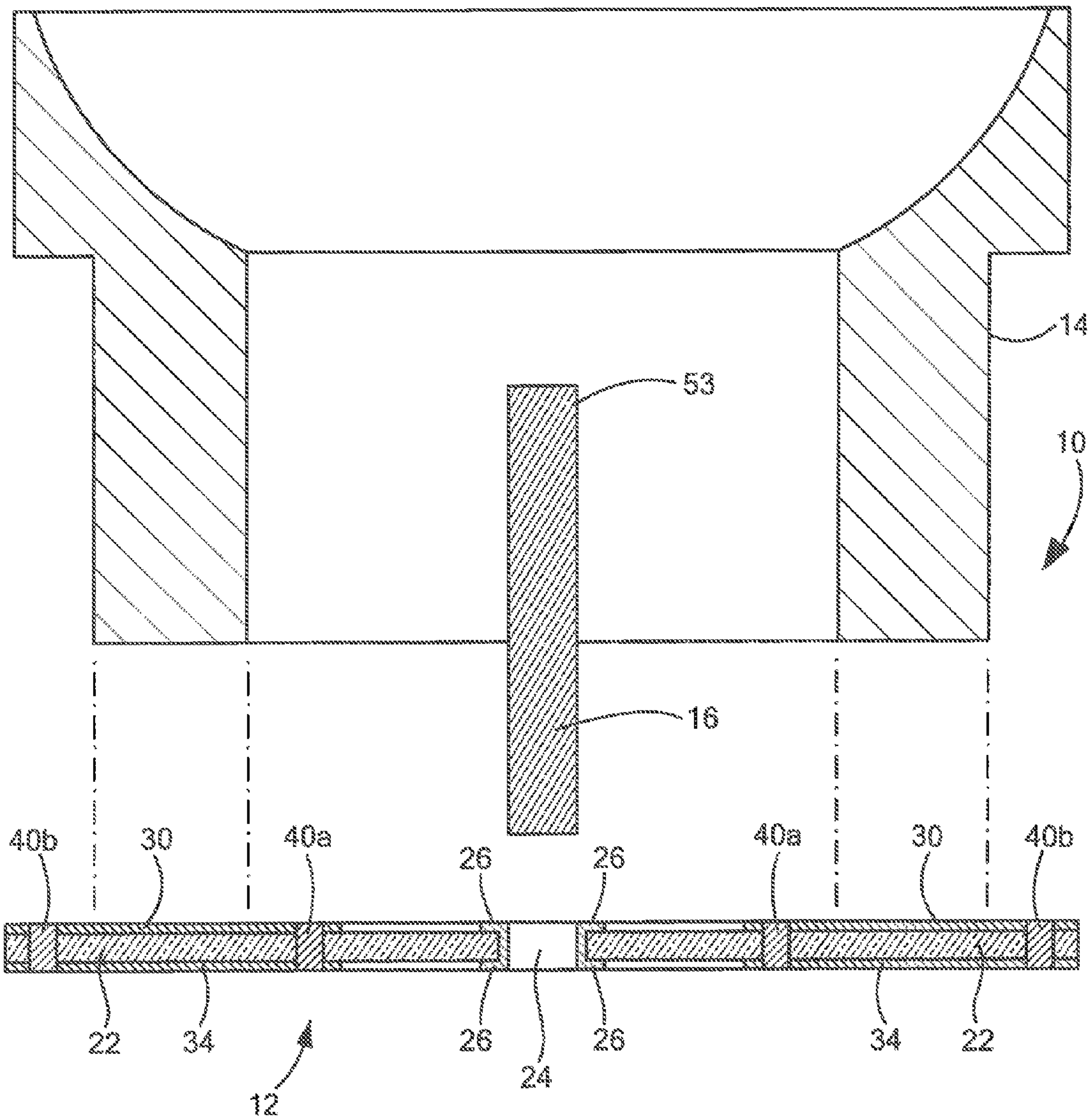
FIG. 3 is an exploded cross sectional view of the an RF connector receptacle of FIG. 1A according the disclosure.

Referring also to FIG. 3, the electrically conductive pin 16 having a mid-portion passes through the hole 24 and is bonded to the electrically conductive layer 26 disposed on the sidewalls of the hole 24. Also shown in FIG. 3, the shell 14 is a hollow electrically conductive shell 14 here for example, copper, provided a receptacle for a coaxial connector such as an Gilbert Push-On (GPO®s a registered trademark of Corning Gilbert, Glendale, Ariz.), SubMiniature version A (SMA), SMPM, connector. Thus, in the case of an SMA connector the inner walls of the shell would be threaded and the outer walls of the SMA connector would be threaded onto the shell 14. For an GPO connector, the GPO connector would be press fit into the inner walls of the shell 14. The electrically conductive shell 14 is disposed around the upper portion of the electrically conductive pin 16, the electrically conductive pin 16 being disposed to provide a signal conductor for the connector receptacle 10 and the electrically conductive shell 14 providing a ground plane conductor for the RF connector receptacle 10. The bottom portion of the shell 14 is mounted to the upper electrically conductive layer 30 which is electrically connected to the upper region s of the electrically conductive vias 40*a*.

Figure 4:
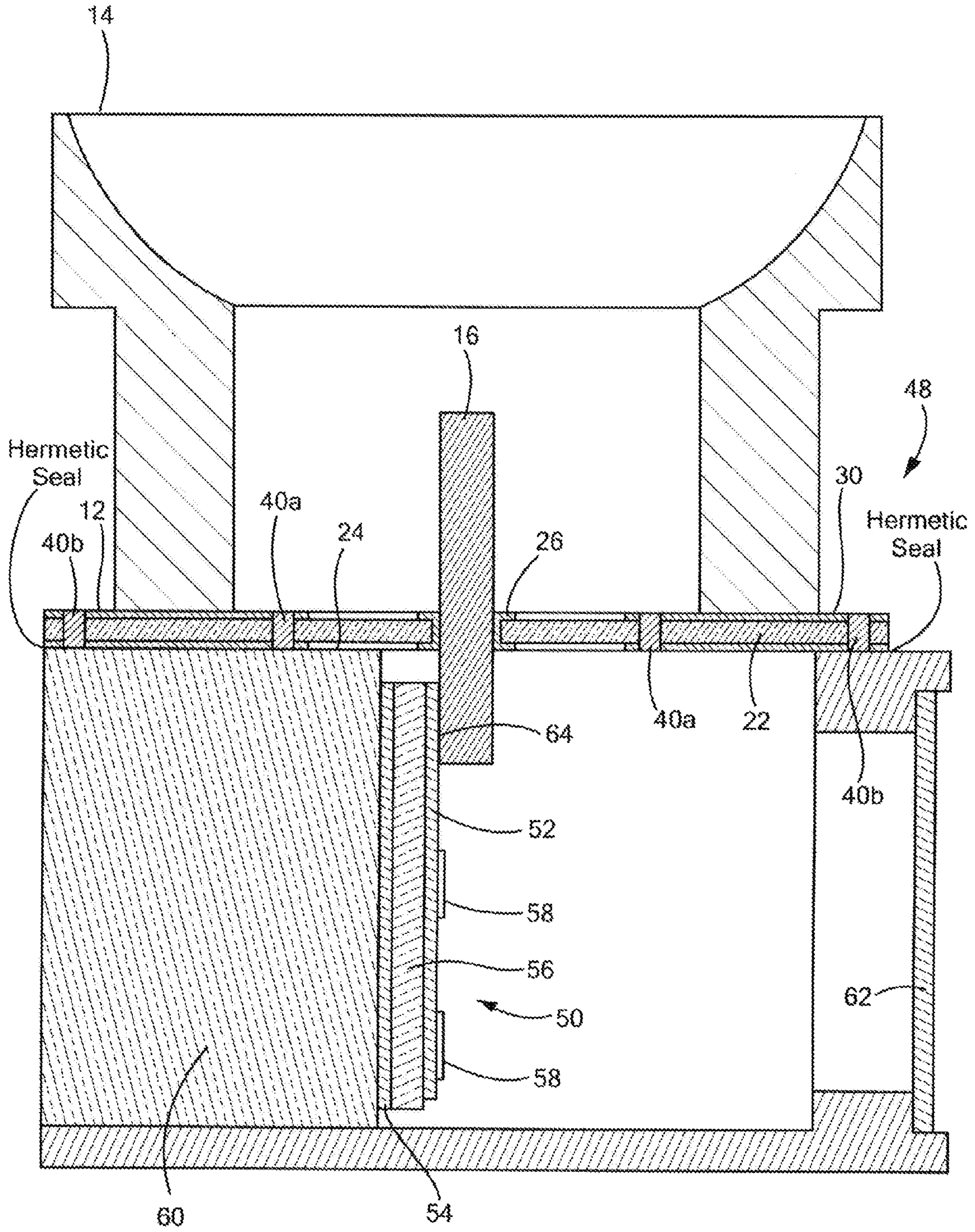
FIG. 4 is a cross sectional view of the an RF connector receptacle of FIG. 1A bonded to a hermetically sealed package having therein a microwave transmission line structure connected to the RF connector receptacle of FIG. 1A according the disclosure.

Referring now to FIG. 4, a package 48 is shown. A microwave structure 50, here a microstrip transmission line structure having a strip conductor 52 separated from a ground plane conductor 54 by a dielectric substrate 56. Electrical components 58 are connected to the microwave structure 50 in any conventional manner. Prior to hermetically sealing the top lid 62 of the package 48, the microwave structure 50 is placed within the package 48 and the ground plane conductor 54 is bonded to an electrically conductive bottom wall 60 of the package 48. The distal end 64 of the pin 16 is bonded to an end of the strip conductor 52. Next, the lower portion of the electrically conductive layer 24 and lower portion of the conductive vias 40*a*, 40*b*, of base 12 are bonded, electrically connected and hermetically sealed, to the a side of the conductive bottom wall 60 and an upper portion of the package 48, as shown.

Figure 5A:
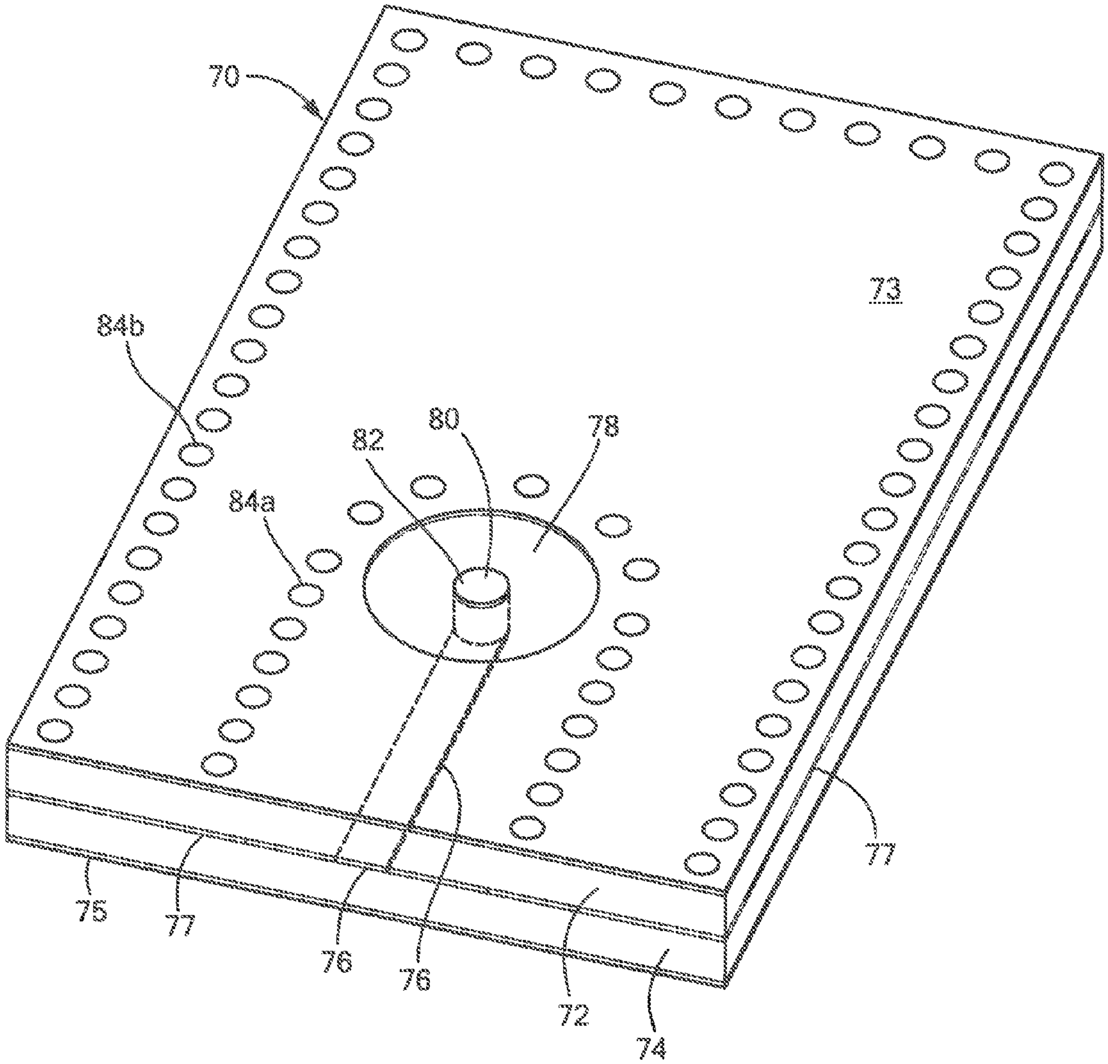
FIGS. 5A-5D is a series of perspective views of the RF connector receptacle of FIG. 1A connected to a stripline structure to provide a coaxial to stripline transition structure at stages in the fabrication thereof according to the disclosure.
Figure 5B:
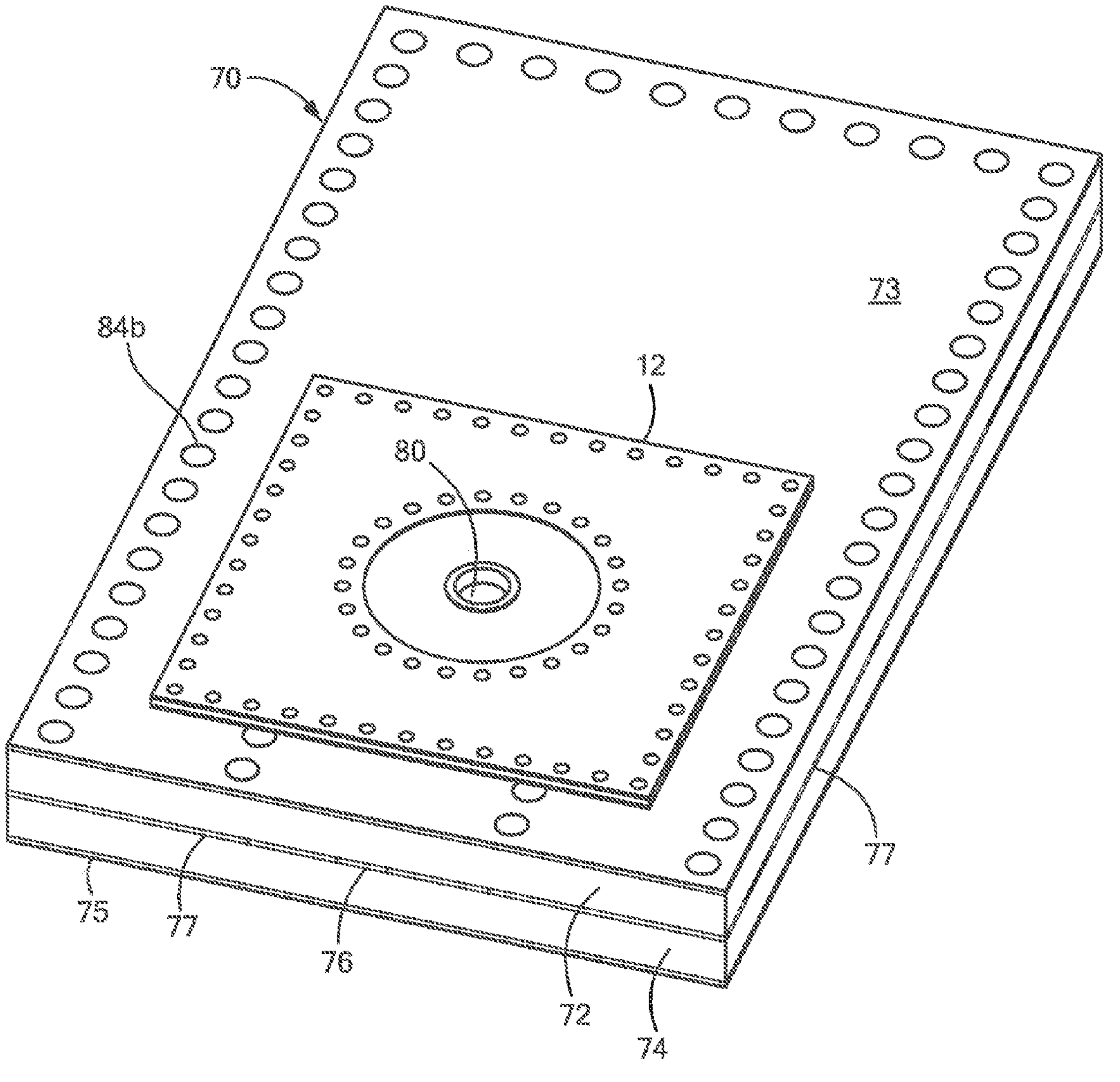
Figure 5C:
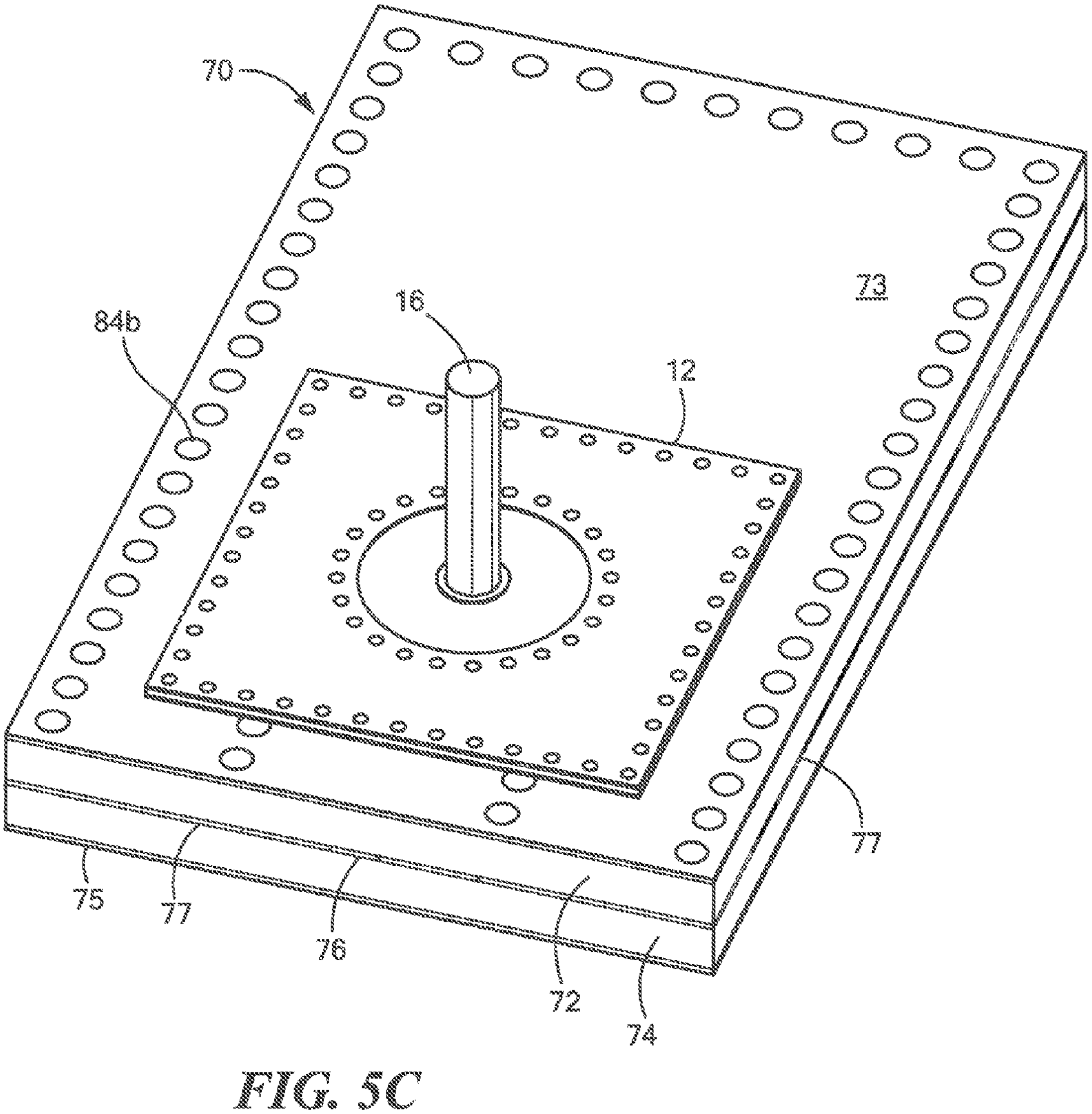
Figure 5D:
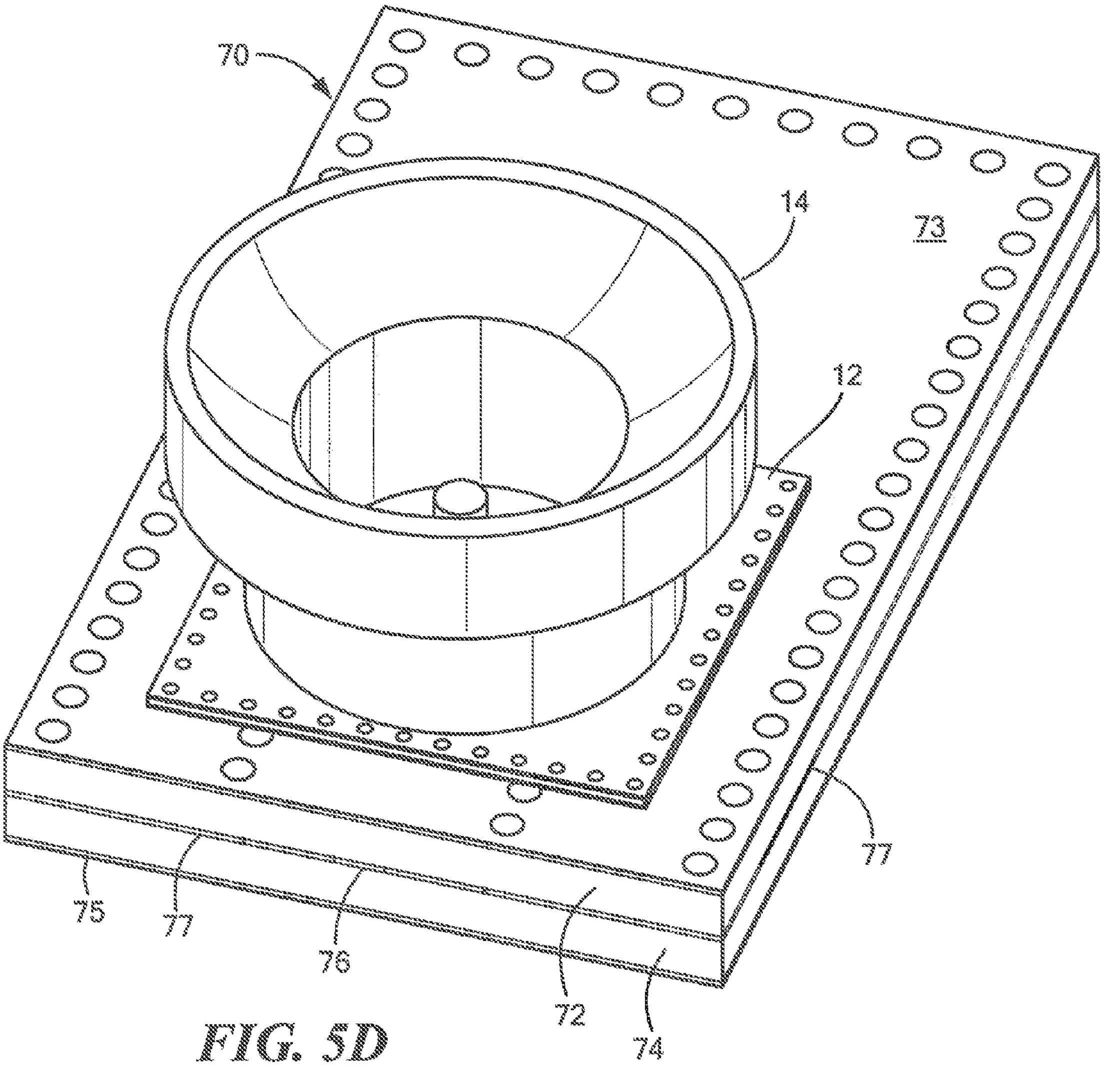
Figure 6A:
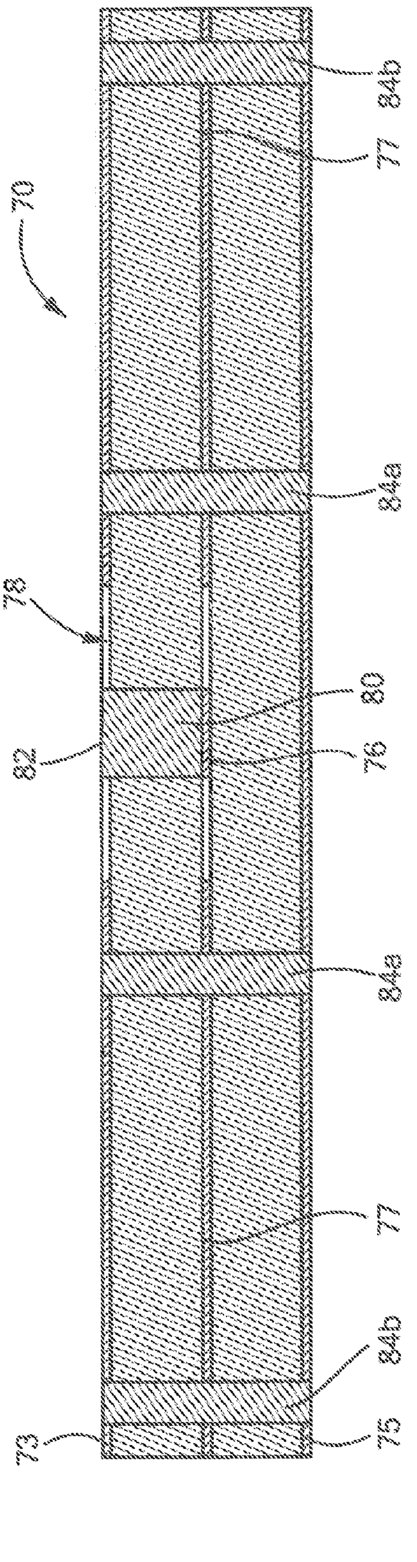
FIGS. 6A-6D is a series of cross sectional views of the RF connector receptacle of FIG. 1A connected to a stripline structure to provide the coaxial to stripline transition structure of FIGS. 5A-5D according to the disclosure.

Referring now to FIGS. 5A-5D and 6A-6D, another embodiment of the disclosure is shown. Here the connector receptacle 10 is used to connect to a microwave stripline transmission line structure 70 (FIGS. 5A and 6A). Thus, a coaxial to stripline transition structure is provided. The structure 70 includes a pair of dielectric layers 72, 74 having a strip conductor 76 between the layers 72, 74. The structure 70 includes an upper electrically conductive ground plane layer 73 on the upper surface of the dielectric layer 72 and a lower electrically conductive ground plane layer 75 on the bottom surface of dielectric layer 74. The upper electrically conductive ground plane layer 73 has an aperture 78 therein. An electrically conductive via 80 is disposed in the center of the aperture 78 and passes through the dielectric layer 72 to electrically connect with an end 82 of the strip conductor 76. The strip conductor 76 is shielded by ground plane conductor layers 77; it being noted that the ground plane conductor layers 77 are sufficiently spaced from the strip conductor 76 so as not to provide a coplanar waveguide transmission line. More particularly, the layers 77 should be at least 1.5 times the spacing between the strip conductor 76 and the upper or lower electrically conductive ground plane layers 73, 75, preferably 2.5 times to 3 times the spacing between the strip conductor 76 and the upper or lower electrically conductive ground plane layers 73, 75. A plurality of electrically conductive vias 84*a*, 84*b* are provided to electrically connect the upper electrically conductive ground plane layer 73 on the upper surface of the dielectric layer 72 to the lower electrically conductive around plane layer 75 on the bottom surface of dielectric layer 74 and the ground plane conductor layer 77.

Figure 6B:
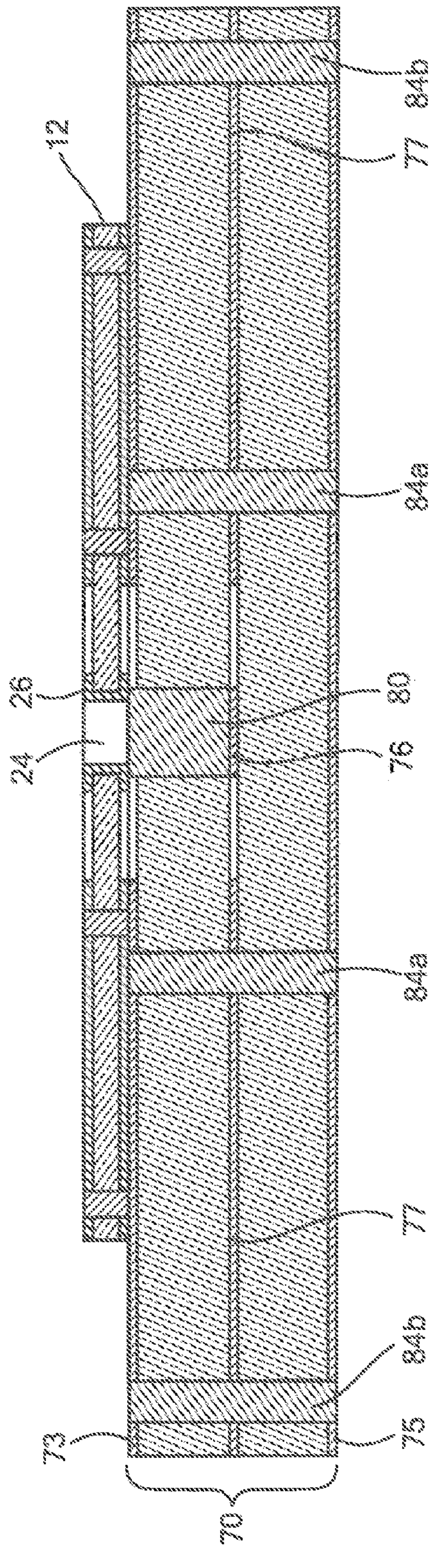

Next, the base 12 is bonded to the upper surface of the microwave stripline transmission line structure 70 as shown in FIGS. 5B and 6B. It is noted that the bottom conductive layer 34 of base 12 (FIG. 3) is connected to the upper electrically conductive ground plane layer 73 of microwave stripline transmission line structure 70.

Figure 6C:
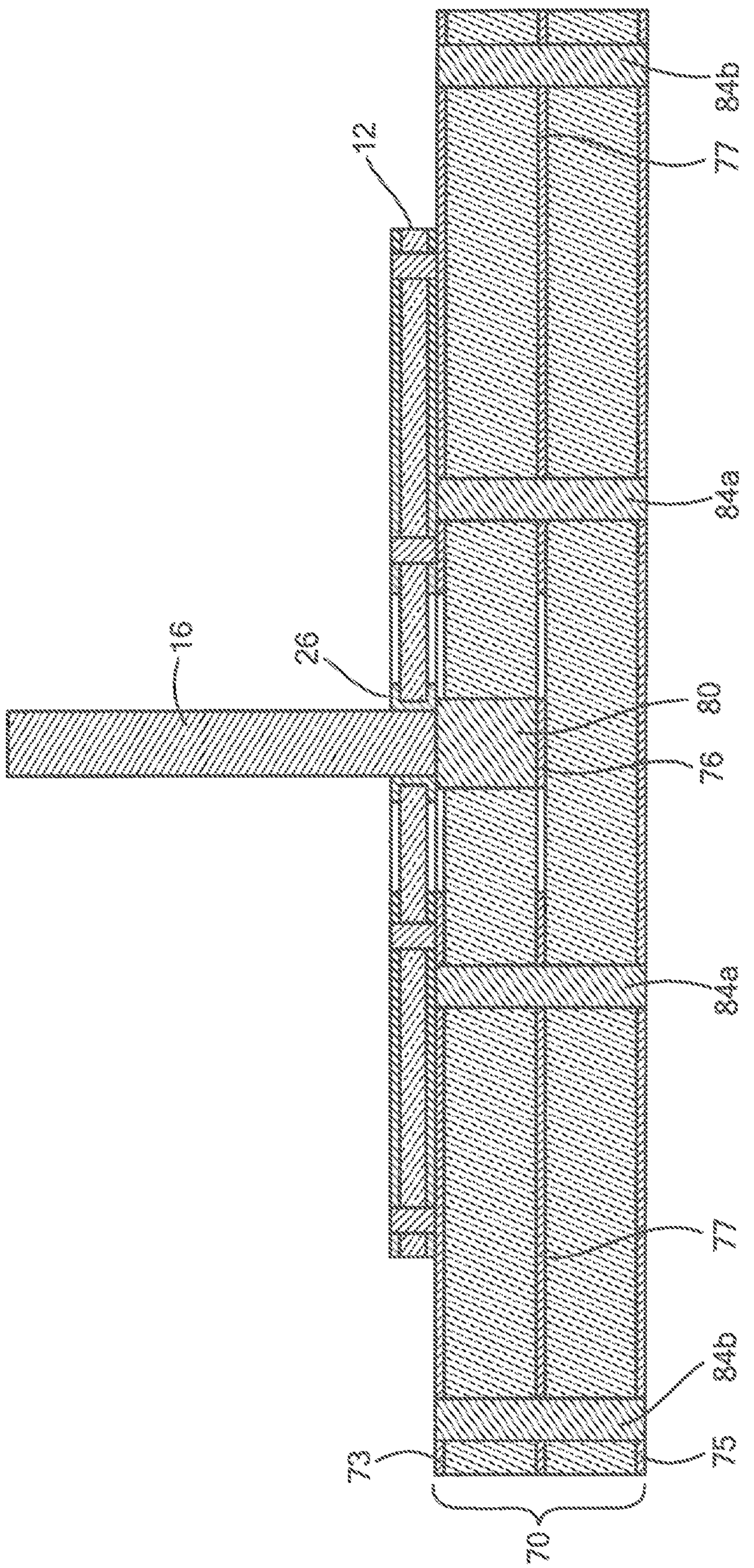

Next, the pin 16 has its bottom end soldered to the top of the electrically conductive metal layer 26 and the top of conductive via 80 as shown in FIGS. 5C and 6C.

Figure 6D:
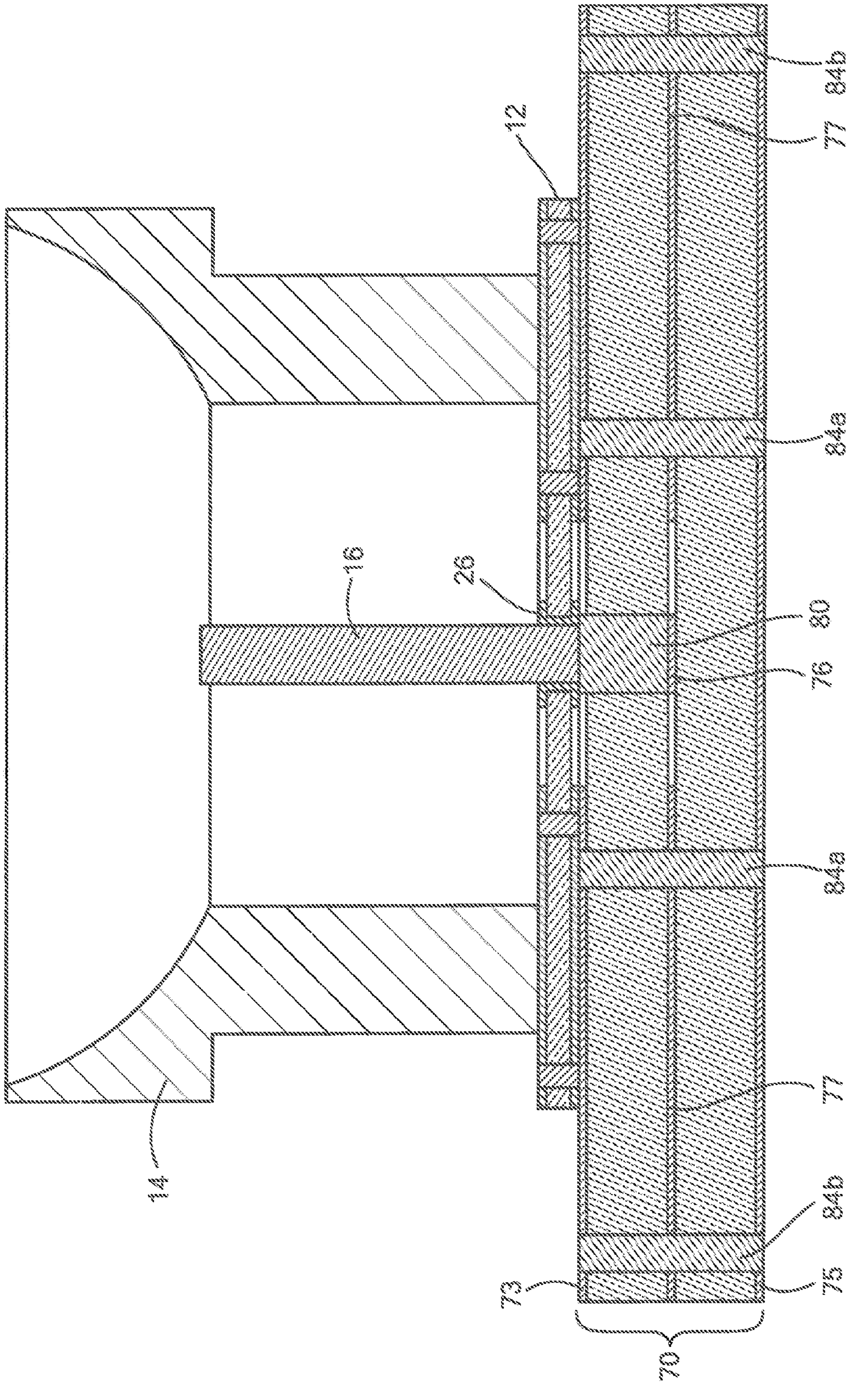

Next, the outer shell 14 is soldered to the upper surface of the base 12, as shown in FIGS. 5D and 6D.

One fabrication method that may be used to form the RF connector receptacle 10 is as follows: Utilizing an electrically insulating substrate 22, such as 4 mil thick SiC, photoresist is spun onto the top side of the substrate 22. Using standard photolithography techniques, a mask is pattern in the shape of the desired metalized aperture 23. Electrically conductive layer 26 is then deposited over the mask and onto the exposed portions of the upper surface 30 of the substrate 22 using either evaporation or sputtering techniques. Next, the mask is removed along with the portions of the metal thereon forming the aperture 23 in the electrically conductive metal layer 26. Next, through vias 40*a*, 40*b* are formed after their location is defined using a similar photolithographic process on the lower surface 25 of the substrate 22. Plasma etch technology is, for example, used to form via through holes through the substrate 22. With via holes formed, a seed layer of metal is sputter on the backside of the substrate 22 and into via holes 40*a*, 40*b* prior to plating the bottom side with metal layer 34. A photoresist is spun onto the lower surface 25 in the portion of the lower surface 25 wherein the aperture 32 is to be formed in the same manner as used to form aperture 23. Thus, metal layer 34 is then deposited over the mask and onto the exposed portions of the lower surface 25 of the substrate 22 using either evaporation or sputtering techniques. Next, the mask is removed along with the portions of the metal thereon forming the aperture 32 in the electrically conductive metal layer 26. The unwanted metal is then etched away. The photoresist is stripped leaving the desire aperture 32 and plated via conductors 40*a*, 40*b*. The next step is to solder a mechanical connector receptacle shell 14 to the topside electrically conductive metal layer 26. The metal pin 16 is then inserted through one of the plated through hole 24 and soldered in place forming the RF connector receptacle 10.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A radio frequency energy connector receptacle, comprising:

(A) a base, comprising:

(i) a dielectric substrate having a hole passing therethrough between an upper surface of the substrate and a lower surface of the substrate;

(ii) an electrically conductive layer disposed on sidewalls of the hole, a portion of the electrically conductive layer being disposed on portions of the upper surface and lower surface of the substrate contiguous to the sidewalls of the hole;

(iii) an upper electrically conductive layer disposed on the upper surface of the substrate, such upper electrically conductive layer having an aperture therethrough exposing an underlying portion of the upper surface of the substrate;

(iv) a lower electrically conductive layer disposed on the lower surface of the substrate, such lower electrically conductive layer having an aperture therethrough exposing an underlying portion of the lower surface of the substrate;

(v) wherein the aperture in the upper electrically conductive layer is vertically aligned with the aperture in the lower electrically conductive layer;

(vi) wherein the hole is disposed coaxially within the aperture in the upper electrically conductive layer and the lower electrically conductive layer;

(vii) a plurality of electrically conductive vias passing through the substrate between the upper electrically conductive layer and the lower electrically conductive layer, the electrically conductive vias being disposed about the aperture in the upper electrically conductive layer and the aperture in the lower electrically conductive layer, the electrically conductive vias electrically interconnecting the upper electrically conductive layer and the lower electrically conductive layer;

(viii) an electrically conductive pin having a mid-portion passing through the hole and being connected and bonded to the electrically conductive layer disposed on the sidewalls of the hole;

(ix) a hollow electrically conductive shell in contact with the upper surface; and (x) wherein the electrically conductive shell is disposed around an upper portion of the electrically conductive pin, the electrically conductive pin having an end projecting outwardly from the lower surface of the substrate and being disposed to provide a signal conductor for the connector receptacle and the electrically conductive shell providing a ground plane conductor for the connector receptacle; and (B) a package, having an open region enclosed by a bottom, a top and sidewalls, comprising:

(i) a microwave structure disposed within the open region of the package, the open region being the microwave structure having an electrical component separated from a ground plane conductor by a dielectric substrate, the ground plane conductor being bonded to a bottom of the package;

(ii) wherein the base forms one of the sidewalls, such base being bonded to the upper portion of the package and the bottom of the package to hermetically seal the microwave structure within the open region; and (iii) wherein of the end of the electrically conductive pin is in contact with, and electrically connected, to the electrical component of the microwave structure and the lower electrically conductive layer is electrically connected to the bottom of the package.

* * * * *